United States Patent
Ma

(10) Patent No.: US 10,444,902 B2
(45) Date of Patent: Oct. 15, 2019

(54) TOUCH SENSOR AND TOUCH SCREEN

(71) Applicant: Japan Display Inc., Minato-ku (JP)

(72) Inventor: Chunche Ma, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 33 days.

(21) Appl. No.: 15/668,879

(22) Filed: Aug. 4, 2017

(65) Prior Publication Data
US 2018/0059869 A1 Mar. 1, 2018

(30) Foreign Application Priority Data
Aug. 31, 2016 (JP) .................................. 2016-170044

(51) Int. Cl.
| | | |
|---|---|---|
| G06F 3/044 | (2006.01) | |
| G06F 3/041 | (2006.01) | |
| H01L 27/32 | (2006.01) | |
| H01L 51/52 | (2006.01) | |
| G09G 3/3258 | (2016.01) | |
| G09G 3/3266 | (2016.01) | |

(52) U.S. Cl.
CPC ............ *G06F 3/0418* (2013.01); *G06F 3/044* (2013.01); *G06F 3/0412* (2013.01); *G06F 3/0414* (2013.01); *H01L 27/323* (2013.01); *H01L 51/5253* (2013.01); *G06F 2203/04105* (2013.01); *G09G 3/3258* (2013.01); *G09G 3/3266* (2013.01); *G09G 2300/0426* (2013.01); *G09G 2310/08* (2013.01); *G09G 2330/021* (2013.01); *H01L 27/3276* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0079360 A1* | 4/2008 | Kubota | ............... | H01L 51/5246 313/505 |
| 2010/0020032 A1* | 1/2010 | Mamba | ................... | G06F 3/044 345/173 |
| 2010/0182255 A1* | 7/2010 | Jeong | ...................... | G06F 3/044 345/173 |

(Continued)

FOREIGN PATENT DOCUMENTS

JP 2013-206198 10/2013

*Primary Examiner* — Temesghen Ghebretinsae
*Assistant Examiner* — Sosina Abebe
(74) *Attorney, Agent, or Firm* — Oblon, McClelland, Maier & Neustadt, L.L.P.

(57) ABSTRACT

A touch sensor includes first electrodes which are driving electrodes of the touch sensor, second electrodes which are detecting electrodes of the touch sensor, third electrodes, and an insulating film which is stacked on the first electrodes. Each of the first electrodes extends in a first direction. Each of the second electrodes and each of the third electrodes are formed on the insulating film, and extend in a second direction. The second electrodes overlap with partial regions of the first electrodes, and the third electrodes overlap with other partial regions of the first electrodes and are formed in gaps between the second electrodes. A film thickness of the insulating film between the first electrodes and the third electrodes varies due to pressing force in a film thickness direction, and the insulating film constitutes the electrostatic capacitance-type pressure sensor with first electrodes and the third electrodes.

18 Claims, 15 Drawing Sheets

(56) References Cited

U.S. PATENT DOCUMENTS

| | | | | |
|---|---|---|---|---|
| 2011/0012815 A1* | 1/2011 | Tsubata | G02F 1/136213 | 345/55 |
| 2011/0095770 A1* | 4/2011 | Kurashima | G06F 3/044 | 324/679 |
| 2012/0127123 A1* | 5/2012 | Onishi | G06F 3/044 | 345/174 |
| 2012/0182258 A1* | 7/2012 | Kubo | G06F 3/03547 | 345/173 |
| 2012/0287079 A1* | 11/2012 | Sato | G06F 3/044 | 345/174 |
| 2013/0050137 A1* | 2/2013 | Yang | G06F 3/044 | 345/174 |
| 2013/0222325 A1* | 8/2013 | Cok | G06F 3/044 | 345/174 |
| 2014/0111476 A1* | 4/2014 | You | G09G 3/3655 | 345/174 |
| 2016/0188082 A1* | 6/2016 | Ham | G06F 3/0416 | 345/174 |
| 2017/0024037 A1* | 1/2017 | Ishizaki | G06F 3/044 | |
| 2017/0060340 A1* | 3/2017 | Chen | G06F 3/0412 | |

* cited by examiner 70a,72a,74a (RELATED ART)

TOUCH SENSOR AND TOUCH SCREEN

CROSS-REFERENCE TO RELATED APPLICATION

The present application claims priority from Japanese application JP2016-170044 filed on Aug. 31, 2016, the content of which is hereby incorporated by reference into this application.

BACKGROUND OF THE INVENTION

1. Field of the Invention

The present invention relates to a touch sensor and a touch screen which is a display device provided with the touch sensor.

2. Description of the Related Art

As an input unit in an electronic device in recent times, a touch operation in which a subject is selected by directly touching a screen with a finger or a pointing device is widely performed, and a touch sensor for detecting the touched coordinates is provided in such an electronic device. FIG. 15 is a schematic plan view illustrating an example of an electrode structure of a projection electrostatic capacitance-type touch sensor of the related art. A touch sensor 1 illustrated in FIG. 15 is used for a touch screen and the like.

The touch sensor 1 includes electrodes 2 for a sensor which are formed on one surface of a substrate. The electrodes 2 include a plurality of X electrodes 2x which extend in an X axis direction and are arranged at intervals in a Y axis direction and a plurality of Y electrodes 2y which extend in the Y axis direction and are arranged at intervals in the X axis direction.

The X electrode 2x includes a plurality of pad electrode portions 4x arranged in the X axis direction and bridge wiring portions 6 connecting the adjacent pad electrode portions 4x to each other. Meanwhile, the Y electrode 2y includes a plurality of pad electrode portions 4y arranged in the Y axis direction and bridge wiring portions 8 connecting the adjacent pad electrode portions 4y to each other. The pad electrode portions 4x and 4y are formed in rhombus shapes in a plan view and are disposed so that two diagonals thereof are arranged along an X axis and a Y axis. The pad electrode portions 4x and the pad electrode portions 4y are alternately disposed (disposed in a checkered shape) in the X axis direction and the Y axis direction. The pad electrode portions 4x and 4y and the bridge wiring portions 6 are formed of the same transparent conductive film, and the bridge wiring portions 8 are formed of a separate layer of a conductive material from the above-described conductive film and connect the pad electrode portions 4y over the bridge wiring portions 6. The X electrodes 2x and the Y electrodes 2y are respectively used as driving electrodes and detecting electrodes of the touch sensor.

SUMMARY OF THE INVENTION

In a case in which a touch sensor is used in combination with other devices, there is a problem in that the touch sensor is likely to catch electromagnetic noise, which is caused by electric signals in the other devices, at detecting electrodes, a signal-to-noise ratio (SN ratio) decreases, and the touch detection accuracy may be deteriorated.

For example, in a touch screen, the touch sensor produced using a transparent substrate, a transparent conductive film, and the like is disposed on a display surface of a display panel. Therefore, a potential of the detecting electrode of the touch sensor varies due to a driving signal of the display panel and the SN ratio may decrease.

The invention provides a touch sensor which is not easily affected by electromagnetic noise from a rear surface side and achieves improvement of the touch detection accuracy in a touch screen.

(1) According to an aspect of the invention, there is provided a touch sensor including first electrodes that are a plurality of driving electrodes of an electrostatic capacitance-type touch sensor, each extend in a first direction, and are arranged in a second direction intersecting the first direction, an insulating film that is stacked on the first electrodes, second electrodes that are a plurality of detecting electrodes of the touch sensor, are formed on the insulating film, overlap with partial regions of the first electrodes, each extend in the second direction, and are arranged in the first direction, and third electrodes that are a plurality of electrodes formed in gaps between the second electrodes, overlapping with other partial regions of the first electrodes, each extend in the second direction, and are arranged in the first direction, on the insulating film, wherein a film thickness of the insulating film between the first electrodes and the third electrodes varies due to pressing force in a film thickness direction, and the insulating film constitutes an electrostatic capacitance-type pressure sensor with the first electrodes and the third electrodes.

(2) According to another aspect of the invention, there is provided a touch screen including a plurality of pixels that are formed on a substrate and each include a light emitting element, a sealing layer that is provided to cover the plurality of pixels, first electrodes that are a plurality of driving electrodes of an electrostatic capacitance-type touch sensor, are formed on the sealing layer, each extend in a first direction, and are arranged in a second direction intersecting the first direction, an insulating film that is stacked on the first electrodes, second electrodes that are a plurality of detecting electrodes of the touch sensor, are formed on the insulating film, overlap with partial regions of the first electrodes, each extend in the second direction, and are arranged in the first direction, and third electrodes that are a plurality of electrodes formed in gaps between the second electrodes, overlapping with other partial regions of the first electrodes, each extend in the second direction, and are arranged in the first direction, on the insulating film, wherein a film thickness of the insulating film between the first electrodes and the third electrodes varies due to pressing force in a film thickness direction, and the insulating film constitutes an electrostatic capacitance-type pressure sensor with the first electrodes and the third electrodes.

DETAILED DESCRIPTION OF THE INVENTION

Hereinafter, aspects for carrying out the invention (hereinafter, refer to embodiments) will described with reference to drawings. However, the invention can be carried out in a variety of other aspects within the scope of the spirit of the inventions, and is not construed as being limited to a description of the embodiments to be exemplified as follow.

In order to make description clearer, drawings may be schematically illustrated in terms of the width, thickness, shape, and the like of each portion as compared with the actual aspect, but those are simply examples, and do not limit the interpretation of the invention. In this specification and each drawing, elements having the same functions as those described with reference to the preceding drawings are given the same reference sign, and will not be described again.

Furthermore, in the detailed description of the invention, expression "above" or "below" used to define a positional relationship between a certain component and another component, unless otherwise particularly described, indicates not only a case in which the another component is located directly above or directly below the certain component, but also a case in which an additional component is interposed therebetween.

First Embodiment

Figure 1:
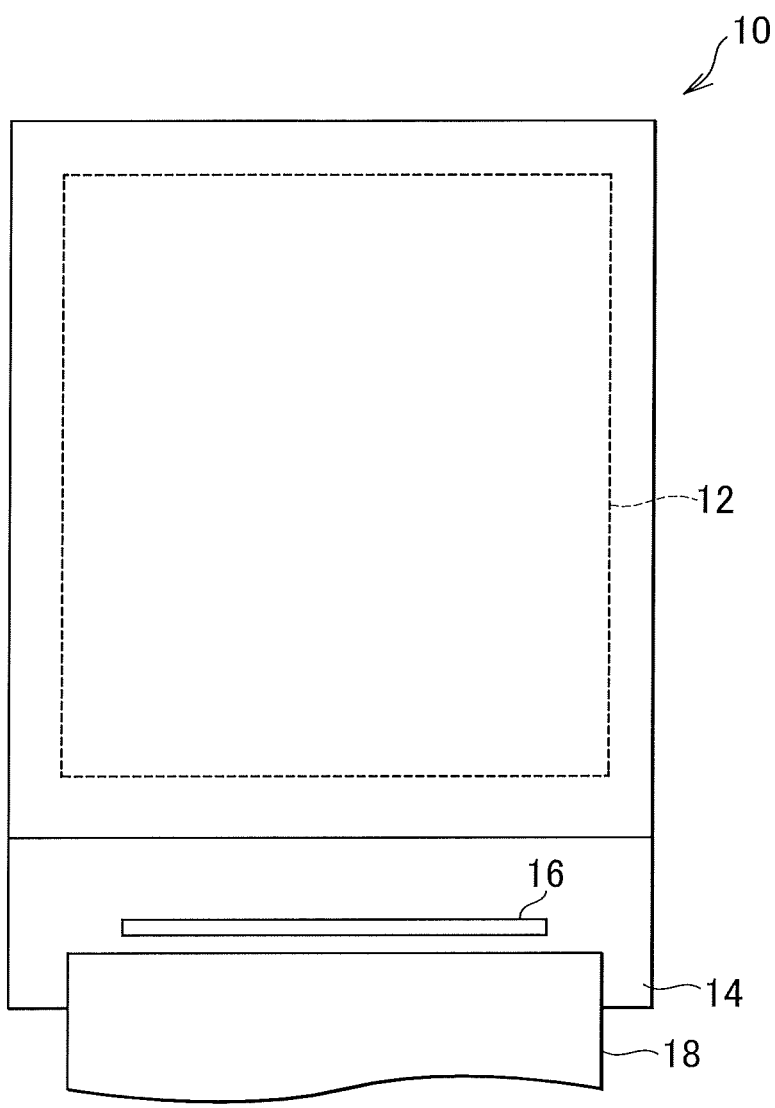
FIG. 1 is a schematic plan view of a touch screen according to an embodiment of the invention.

FIG. 1 is a schematic plan view of an organic electroluminescence (EL) display device according to the embodiment. The display device illustrated in FIG. 1 is a touch screen 10 in which a touch sensor is stacked on a display panel, and structures such as a light emitting element and a sensor are formed on a rectangular array substrate. On a display region 12 of the touch screen 10, a pixel array portion in which pixels including organic light emitting diodes (OLED) which are self light emitting elements are arranged is provided, and an image is displayed. Also, the touch sensor is stacked on a display surface side of the display region 12, and detects approaching and touching of a finger or the like of a user to the display surface or a position thereof. A component mounting region 14 is provided on one side of the array substrate, and a wiring connected to the display region 12 is disposed. Further, a driver IC 16 constituting a driving unit is mounted on, or a flexible printed circuit (FPC) 18 is connected to the component mounting region 14. The driver IC 16 may be mounted on a main surface of the FPC 18. The FPC 18 is connected to a control device relating to operations of the touch screen 10 or to the other circuits.

A display surface protecting film made of a cover glass, a resin film, or the like is attached to the display surface side of the array substrate in which the touch sensor is formed. That is, touch is detected through the protecting film.

Figure 2:
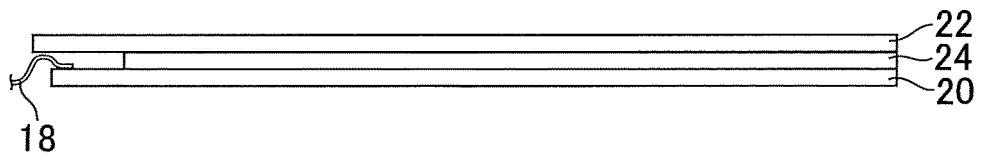
FIG. 2 is a schematic vertical sectional view of the touch screen according to the embodiment of the invention.

FIG. 2 is a schematic vertical sectional view of the touch screen 10 in a state in which the display surface protecting film is attached thereto. The array substrate 20 and the display surface protecting film 22 are bonded to each other through an adhesive layer 24. The display surface protecting film 22 may overlap with a part where the FPC 18 is connected to the array substrate 20.

Figure 3:
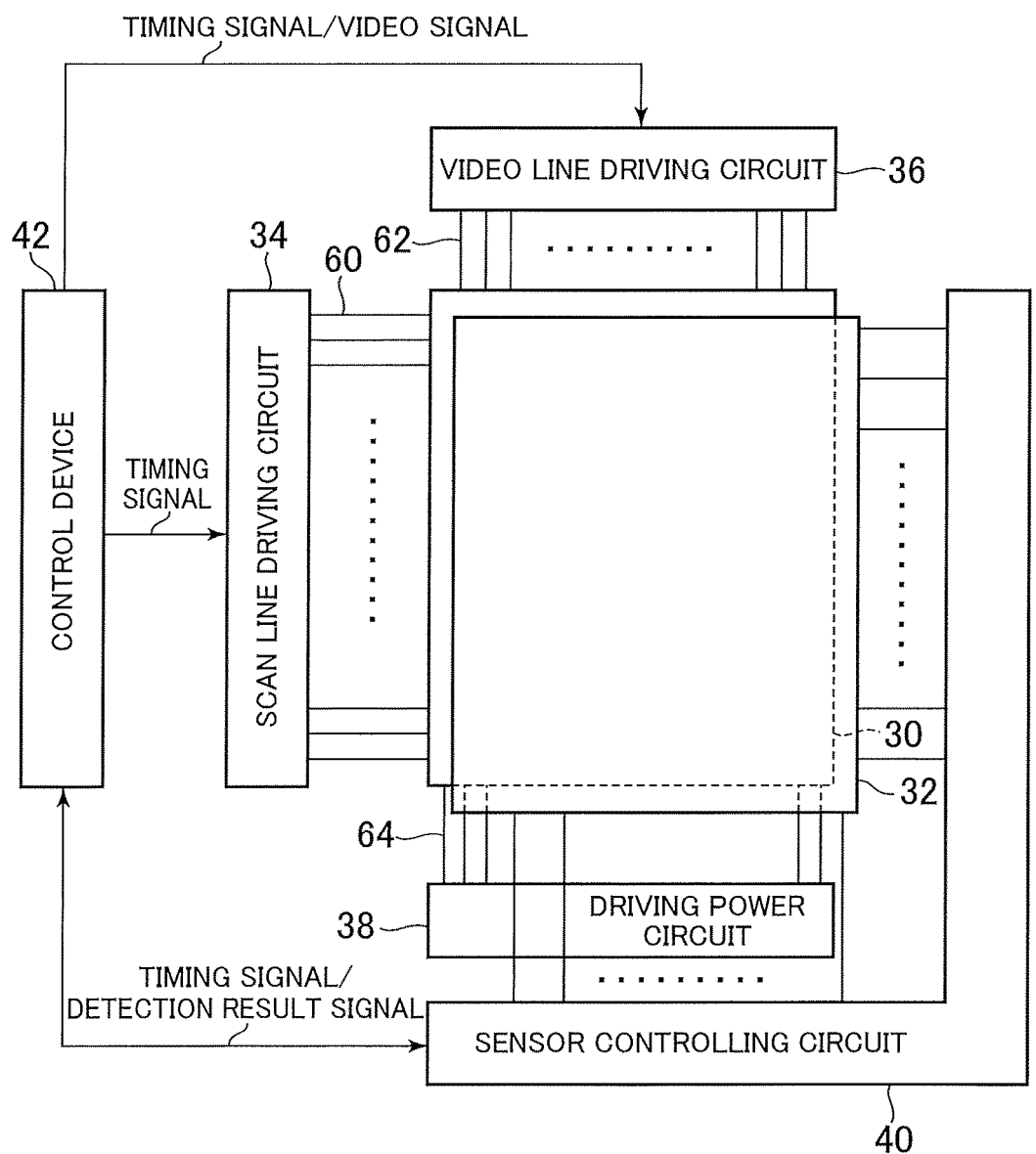
FIG. 3 is a schematic view of a schematic configuration of a display device including the touch screen and a driving circuit according to the embodiment of the invention.

FIG. 3 is a schematic view illustrating a schematic configuration of the display device according to the embodiment. FIG. 3 illustrates a configuration also including circuits for driving the touch screen 10 as the display device, and specifically, the display device is provided with a pixel array portion 30, a touch sensor 32, a scan line driving circuit 34, a video line driving circuit 36, a driving power circuit 38, a sensor controlling circuit 40, and a control device 42.

Figure 4:
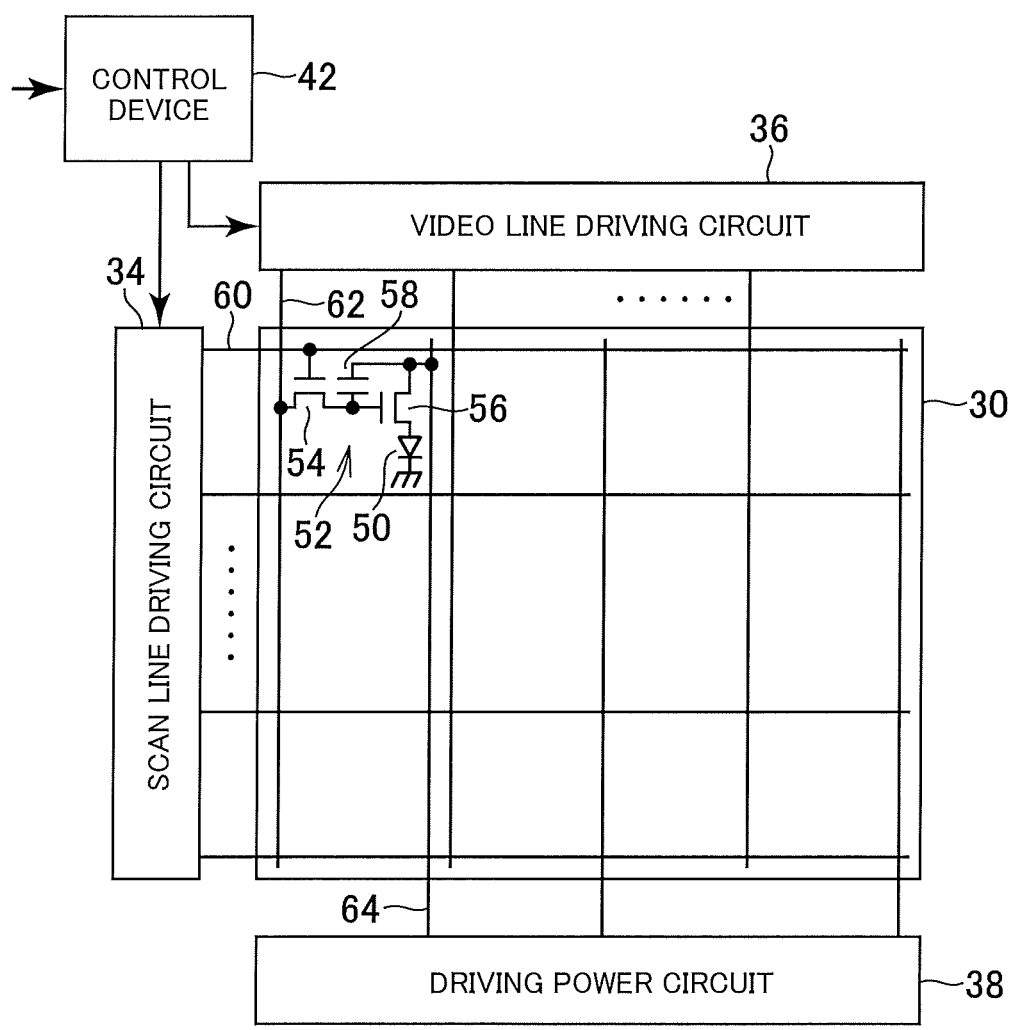
FIG. 4 is a schematic view illustrating a part relating to an image displaying function in the configuration of FIG. 3.

FIG. 4 is a schematic view illustrating a part relating to the pixel array portion 30 in a configuration of FIG. 3, that is, a part relating to an image displaying function. An OLED 50 and a pixel circuit 52 corresponding to a pixel are disposed in a matrix shape on the pixel array portion 30. In an example illustrated in FIG. 4, the pixel circuit 52 is configured with a plurality of TFTs 54 and 56 and a capacitor 58.

The scan line driving circuit 34, the video line driving circuit 36, the driving power circuit 38, and the control device 42 control light-emitting of the OLED 50 by driving the pixel circuit 52.

The scan line driving circuit 34 is connected to a scanning signal line 60 provided in each arrangement (pixel row) of a horizontal direction of the pixel. The scan line driving circuit 34 sequentially selects the scanning signal line 60 by corresponding to a timing signal input from the control device 42, and applies a voltage for turning on a lighting TFT 54 to the selected scanning signal line 60.

The video line driving circuit 36 is connected to a video signal line 62 provided in each arrangement (pixel column) of a vertical direction of the pixel. The video line driving circuit 36 receives a video signal from the control device 42, and outputs a voltage corresponding to the video signal of the selected pixel row to each video signal line 62, according to selection of the scanning signal line 60 by the scan line driving circuit 34. The voltage is written in the capacitor 58 through the lighting TFT 54 in the selected pixel row. The driving TFT 56 supplies current corresponding to the written voltage to the OLED 50, and thus, the OLED 50 of a pixel corresponding to the selected scanning signal line 60 is emitted.

The driving power circuit 38 is connected to a driving power line 64 provided in each pixel column, and current is supplied to the OLED 50 through the driving power line 64 and the driving TFT 56 of the selected pixel row.

Here, an anode of the OLED 50 is connected to the driving TFT 56. Meanwhile, a cathode of each OLED 50 is connected to a constant potential, and the cathode of the OLED 50 of the entire pixels is configured with a common electrode. Here, as the constant potential, a value having a potential difference as much as necessary for emitting the OLED with respect to the driving power line 64 is selected. For example, the value may be a ground potential.

Figure 5:
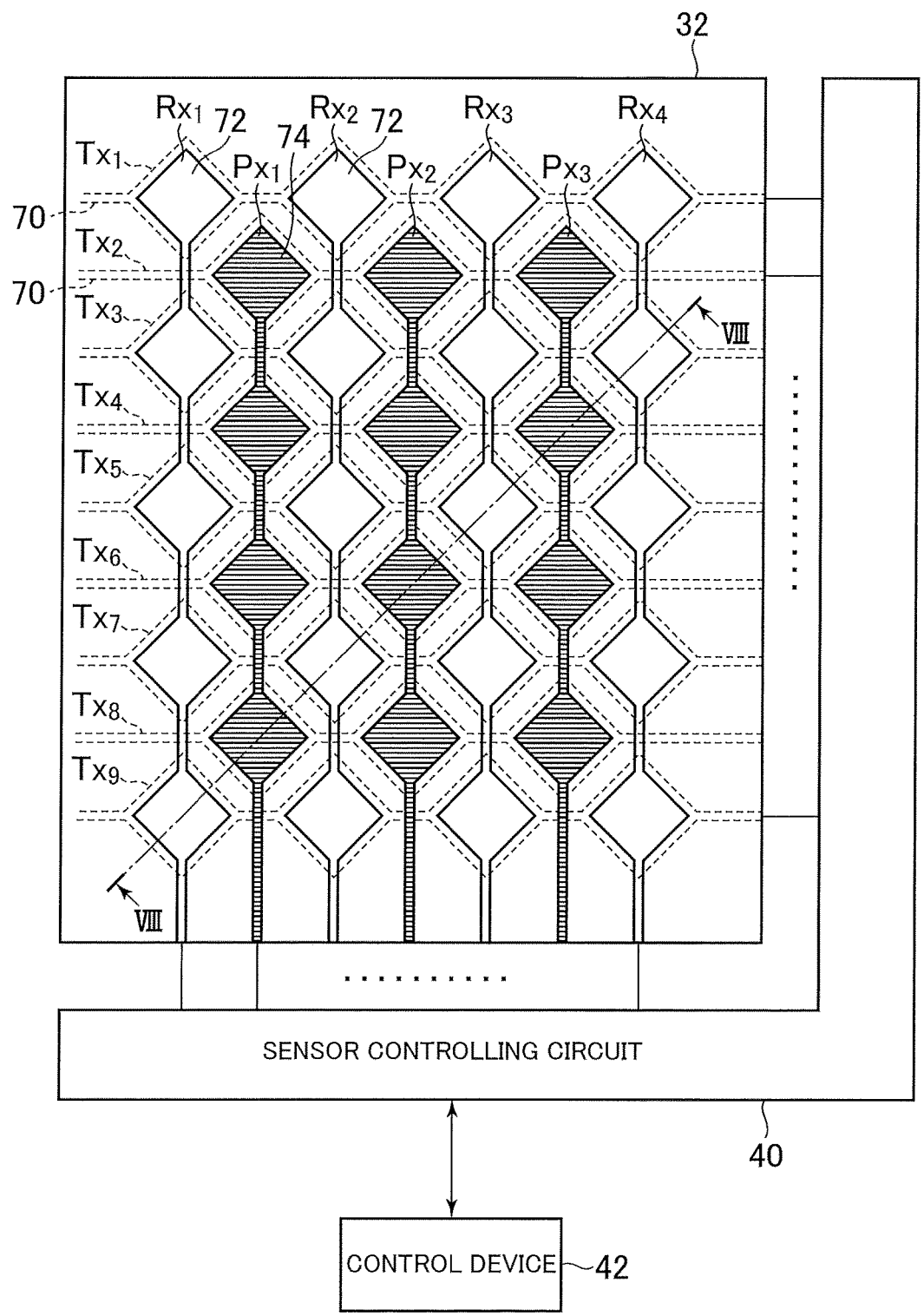
FIG. 5 is a schematic view illustrating a part relating to the touch sensor in the configuration of FIG. 3.

FIG. 5 is a schematic view illustrating a part relating to the touch sensor 32 in the configuration of FIG. 3. The touch sensor 32 has a structure of a pressure sensor which detects pressing force caused by a touching subject, in addition to a structure of a touch sensor which detects presence and absence of touching. Specifically, the touch sensor 32 is provided with the projection electrostatic capacitance-type touch sensor and an electrostatic capacitance-type pressure sensor.

First electrodes 70 and second electrodes 72 are provided in the touch sensor 32 as electrodes which constitute the projection electrostatic capacitance-type touch sensor. The first electrodes 70 (electrodes Tx) are a plurality of driving electrodes of the electrostatic capacitance-type touch sensor, each extend in a horizontal direction which is a first direction, and are arranged in a vertical direction which is a second direction intersecting the first direction. The second electrodes 72 (electrodes Rx) are a plurality of detecting electrodes of the electrostatic capacitance-type touch sensor, overlap with partial regions of the first electrodes 70, each extend in the second direction, and are arranged in the first direction. The first electrodes 70 are formed on a surface of a display panel which is made of an insulating material. The first electrodes 70 are covered with an insulating film stacked thereon, and the second electrodes 72 are formed on the insulating film.

Further, third electrodes 74 which constitute the electrostatic capacitance-type pressure sensor are provided on the insulating film. The third electrodes 74 (electrodes Px) are a plurality of electrodes formed in gaps between the second electrodes 72 overlapping with another partial region in the first electrodes 70, which do not overlap with the second electrodes 72, each extend in the second direction, and are arranged in the first direction. The third electrodes 74 constitute one of two electrodes which are facing each other in the electrostatic capacitance-type pressure sensor and forms capacitance, and the first electrodes 70 constitute the other one of the two electrodes. Moreover, a film thickness of the insulating film between the first electrodes 70, and the second electrodes 72 and the third electrodes 74 in at least a part sandwiched between the first electrodes 70 and the third electrodes 74 varies due to pressing force in a film thickness direction, and therefore, electrostatic capacitance between the first electrodes 70 and the third electrodes 74 which are opposed to each other varies. Pressure can be measured by converting variation of the electrostatic capacitance to electric signals. Here, basically, between the first electrodes 70 and the third electrodes 74 which constitute a capacitor of the electrostatic capacitance-type pressure sensor, the third electrodes 74 close to a surface being touched by a subject function as movable electrodes which are displaced due to pressing force, and the first electrodes 70 function as fixing electrodes.

One end or both ends of each of the electrodes Tx, Rx, and Px are connected to the sensor controlling circuit 40 through wirings. The sensor controlling circuit 40 drives the touch sensor 32 in accordance with a timing signal input from the control device 42, and acquires an electric signal in accordance with presence and absence of touching or magnitude of pressure. Driving of the touch sensor 32 will be described later. For convenience of description at this time, in FIG. 5, a subscript is sequentially given to each of the electrodes Tx from the top, so that a numeral is attached to each of the electrodes like $Tx_1$, $Tx_2$, and ..., and a subscript is sequentially given to each of the electrodes Rx and Px from the left, so that a numeral is attached to each of the electrodes like $Rx_1$, $Rx_2$, and ..., and $Px_1$, $Px_2$, and ....

Figure 6:
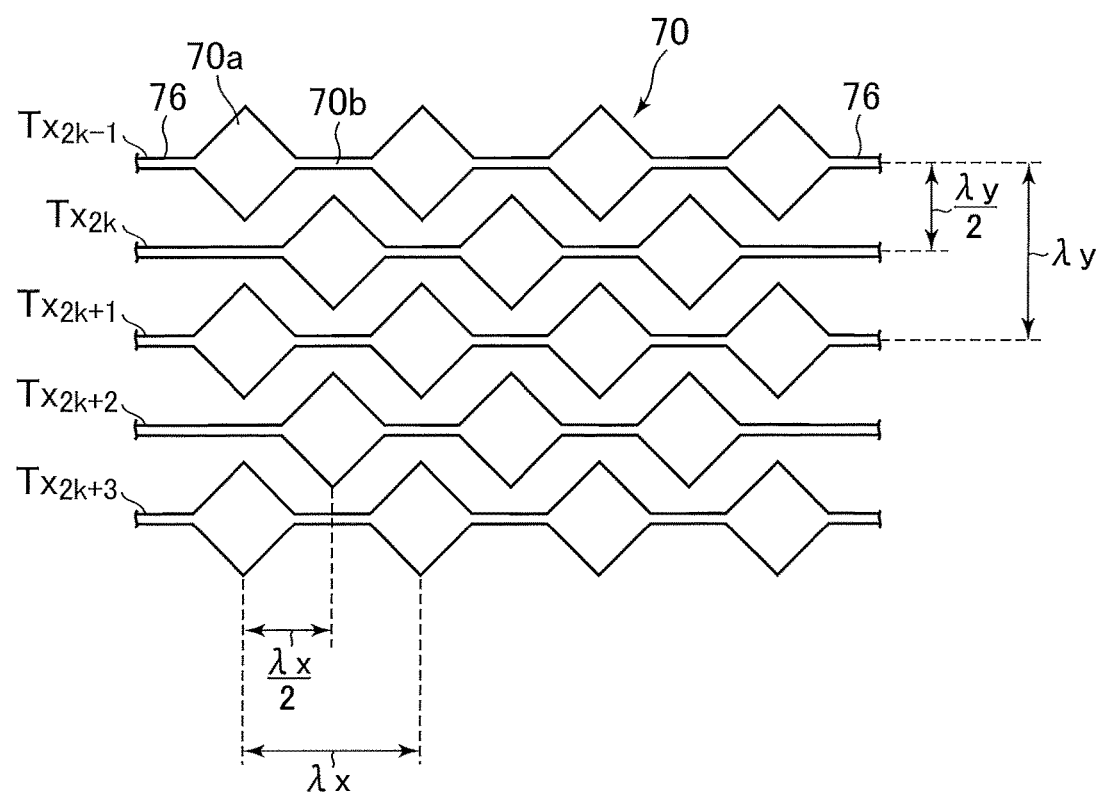
FIG. 6 is a schematic plan view illustrating a pattern of electrodes of a first embodiment of the invention.
Figure 7:
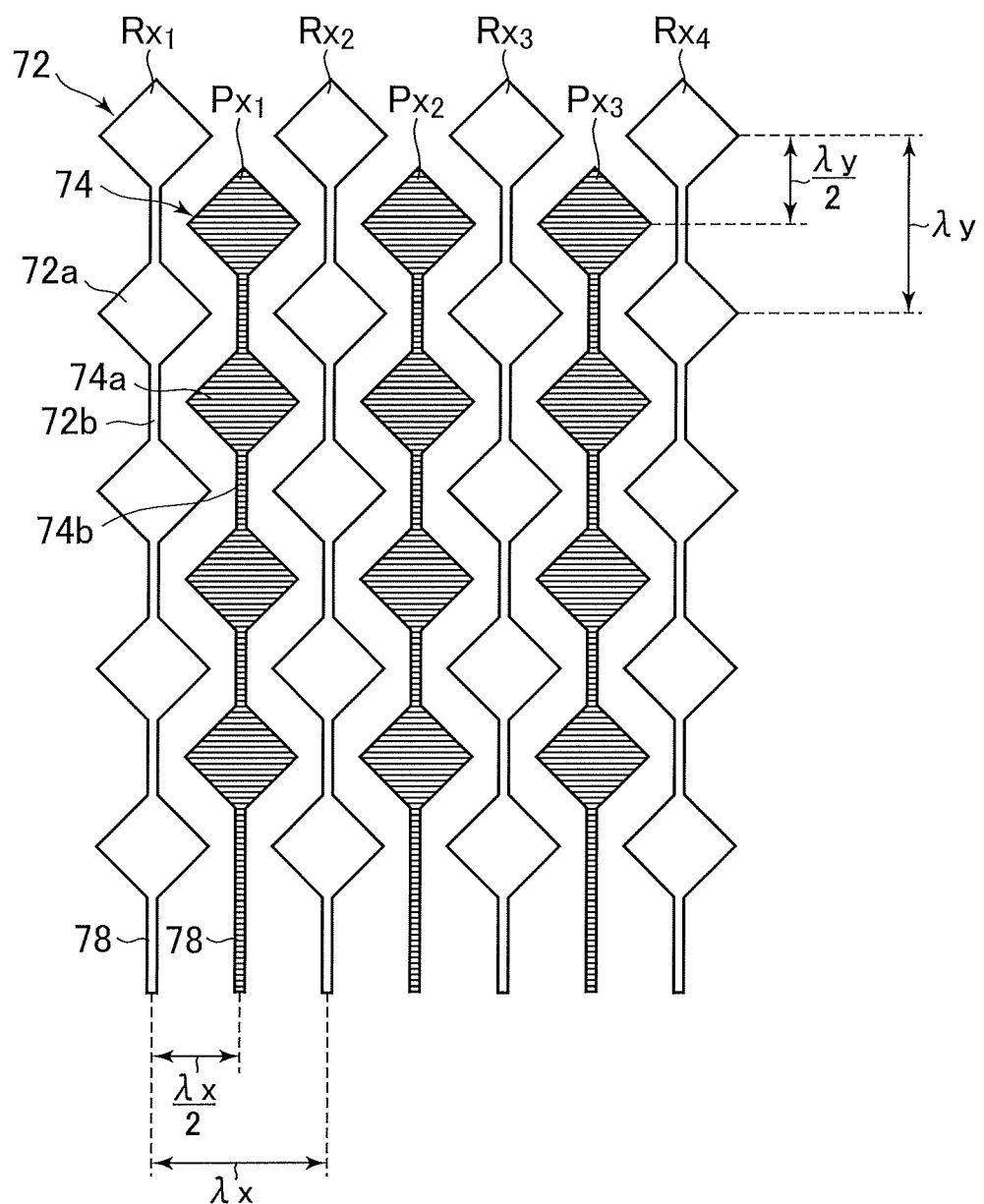
FIG. 7 is a schematic plan view illustrating patterns of electrodes according to the first embodiment of the invention.

Also, the electrodes Tx, Rx, and Px shown in the touch sensor 32 of FIG. 5 are concept views, and particularly, the number of the electrodes or the number of repeating of the electrode patterns is not limited to an example in drawings. FIGS. 6 and 7 as follows will be described in the same manner. In this embodiment, the number of the electrodes Tx is set to α ($Tx_1$ to $Tx_\alpha$), the number of the electrodes Rx is set to β ($Rx_1$ to $Rx_\beta$), and the number of the electrodes Px is set to β-1 ($Px_1$ to $Px_{\beta-1}$). α and β are respectively two or more a natural number, and in an example illustrated in FIG. 5, α is 9, and β is 4.

FIG. 6 is a schematic plan view illustrating patterns of the electrodes Tx. The electrodes Tx are configured with a plurality of pad electrode portions 70a and bridge wiring portions 70b which connect the pad electrode portions 70a to each other. The plurality of pad electrode portions 70a are in rhombus shapes which have basically the same sizes and shapes, and the plurality of pad electrode portions 70a of each of the electrodes Tx are disposed so that diagonals of the rhombus shapes thereof are arranged in a row in the horizontal direction. The adjacent pad electrode portions 70a are connected to each other by the bridge wiring portions 70b between vertices of the rhombus shapes which are opposite to each other. Leading-out wirings 76 are respectively connected to an end portion of each of the electrodes Tx. The leading-out wirings 76 are respectively provided in the outside of the display region 12, that is, in a frame region of the display panel, and connect the electrodes Tx to the sensor controlling circuit 40.

The odd-numbered electrodes Tx and the even-numbered electrodes Tx which are adjacent to the odd-numbered electrodes are alternately disposed. That is, if an arrangement cycle of a horizontal direction of the pad electrode portions 70a in the electrodes Tx is set to $\lambda_x$, between the odd-numbered electrodes Tx and the even-numbered electrode Tx, a difference of $\lambda_x/2$ is provided at a position of the horizontal direction of the pad electrode portions 70a. Also, each of the electrodes Tx is disposed to narrow intervals of the vertical direction. That is, as illustrated in FIG. 6, a position of a horizontal direction of two odd-numbered electrodes $Tx_{2k-1}$ and $Tx_{2k+1}$ (k is a natural number) is set so that diagonals in the vertical direction of the rhombus shapes of the pad electrode portions 70a are arranged in a row on the same straight line, and a position of a vertical direction of the two electrodes is set so that vertexes of the rhombus shapes of the pad electrode portions 70a arranged in a row on the straight line are close to each other. Two even-numbered electrodes $Tx_{2k}$ and $Tx_{2k+2}$ are also disposed in the same manner; however, the pad electrode portions 70a of these electrodes are formed in gap regions of approximately rhombus shapes generated between the odd-numbered electrodes Tx. Accordingly, the electrodes Tx are densely disposed on the display region 12 of the touch screen 10, and most of the display region 12 is covered with the electrodes Tx. Also, if the pad electrode portions have approximately square shapes, an arrangement cycle $\lambda_y$ of the vertical direction of the odd-numbered (or even-numbered) electrodes Tx becomes substantially same as $\lambda_x$.

FIG. 7 is a schematic plan view illustrating patterns of the electrodes Rx and Px. From a conceptual point of view, in electrode patterns of which the electrodes Rx and Px are combined, a horizontal direction and a vertical direction of the electrodes Tx described above are switched each other. That is, each of the electrodes Rx is configured with a plurality of the pad electrode portions 72a and bridge wiring portions 72b connecting the pad electrode portions 72a to each other. The plurality of pad electrode portions 72a have basically rhombus shapes of same sizes and shapes as each other, and the plurality of pad electrode portions 72a of each of the electrodes Rx are disposed so that the diagonals of the rhombus shapes are arranged in a row on a straight line in the vertical direction. The vertexes of the rhombus shapes of the adjacent pad electrode portions 72a, which face each other, are connected to each other by the bridge wiring portions 72b. In the same manner, each of the electrodes Px is configured with a plurality of the pad electrode portions 74a and bridge wiring portions 74b connecting the pad electrode portions 74a to each other. The plurality of pad electrode portions 74a have basically rhombus shapes of same sizes and shapes as each other, and the plurality of pad electrode portions 74a of each of the electrodes Px are disposed so that the diagonals of the rhombus shapes are arranged in a row on a straight line in the vertical direction. The vertexes of the rhombus shapes of the adjacent pad electrode portions 74a, which face each other, are connected to each other by the bridge wiring portions 74b.

The pad electrode portions 72a and 74a of the electrodes Rx and Px are disposed at a position facing the pad electrode portions 70a of the electrodes Tx. A size and a shape of each of the pad electrode portions 72a and 74a can be set to be same as each other, and, the size and the shape thereof can also be set to be same as that of the pad electrode portion 70a.

Leading-out wirings 78 are respectively connected to each end portion of each of the electrodes Rx and Px. In the same manner as the leading-out wiring 76, the leading-out wirings 78 are provided to the outside of the display region 12, and connect the electrodes Rx and Px to the sensor controlling circuit 40.

Figure 8:
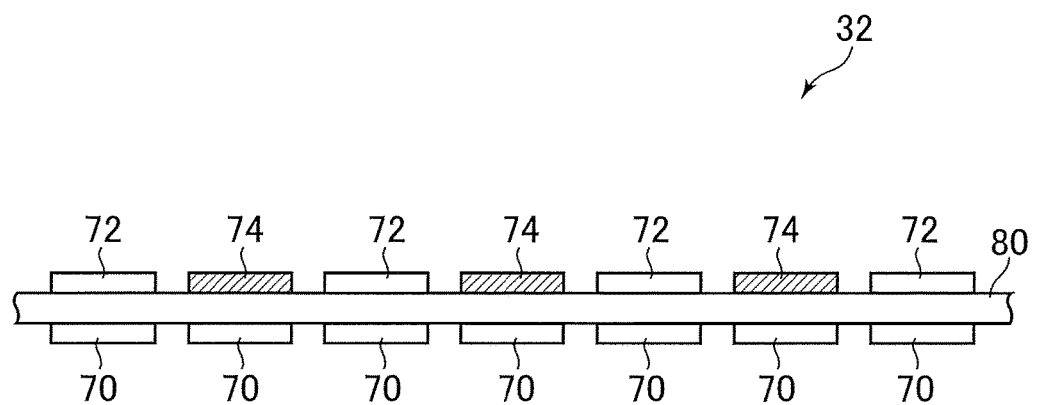
FIG. 8 is a schematic vertical sectional view of the touch sensor, and is a partial sectional view taken along line VIII-VIII illustrated in FIG. 5.

In the embodiment, the electrode Rx and the electrode Px are alternately arranged every other, for example, in the arrangement of the electrodes in the horizontal direction, the odd-numbered electrodes become the electrodes Rx, and the even-numbered electrodes become the electrodes Px. FIG. 8 is a schematic vertical sectional view of the touch sensor 32 in this case, and a partial sectional view taken along line VIII-VIII illustrated in FIG. 5. Each of the first electrodes 70 is disposed to face each of the second electrodes 72 or the third electrodes 74 with the insulating film 80 sandwiched therebetween. Also, as described above, a film thickness of the insulating film 80 at a part sandwiched between at least the first electrodes 70 and the third electrodes 74 varies due to pressing force. For example, a film which is formed of an elastic material can be used as the insulating film 80.

Figure 15:
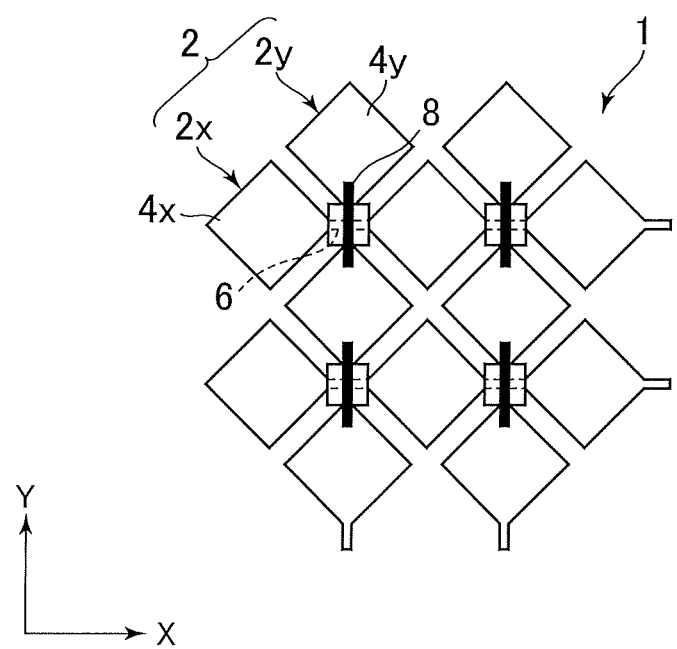
FIG. 15 is a schematic plan view illustrating an example of an electrode structure of a projection electrostatic capacitance-type touch sensor of the related art.

The electrode patterns of the embodiment described with reference to FIG. 5 to FIG. 7 are compared with electrode patterns of an example of the related art of FIG. 15. Here, in the touch sensor 1 illustrated in FIG. 15, X electrodes 2x are set to the driving electrodes Tx, and Y electrodes 2y are set to the detecting electrodes Rx. In the touch sensor 1 of the example of the related art, pad electrode portions 4x of the electrodes Tx and pad electrode portions 4y of the electrodes Rx are arranged in a checkered pattern. With respect that, in the touch sensor 32 of the invention, the electrodes Tx are formed on the display panel nearer than the electrodes Rx by using a layer different from that of the electrodes Rx, and the pad electrode portions 70a of the electrodes Tx are not only disposed on interval regions of the pad electrode portions 72a of the electrodes Rx but also disposed on a region overlapping with the pad electrode portion 72a. That is, the electrodes Tx of the touch sensor 32 are densely laid on the display region 12 at basically double density of that of the electrodes Rx. Further, the driving electrodes Tx are connected to the sensor controlling circuit 40 and maintained at a low impedance. The electrodes Tx, which are maintained at the low impedance and are densely disposed, have a shielding function for blocking the electrode Rx from noise caused by a driving signal of the display panel. That is, the detecting electrodes Rx of the touch sensor 32 are difficult to catch electromagnetic noise from the display panel which is positioned on a rear surface side of the touch sensor 32. Accordingly, it achieves that a ratio of SN of the touch sensor 32 is improved and touch detection accuracy of the touch sensor 32 or the touch screen 10 is also improved.

Figure 9:
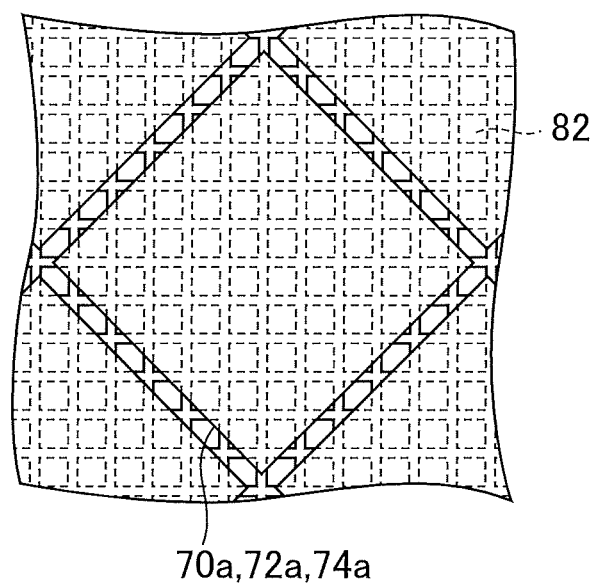
FIG. 9 is a schematic plan view illustrating a relationship of sizes of pad electrode portions of the electrodes of the touch sensor and pixels of a display panel.

FIG. 9 is a schematic plan view illustrating a relationship of sizes of the pad electrode portions 70a, 72a, and 74a of each of the electrodes Tx, Rx, and Px of the touch sensor 32 and pixels 82 which constitute the pixel array portion 30 of the display panel, and the pad electrode portions are basically illustrated much bigger than the pixels. For example, in a touch sensor being used in a display panel in which a screen size is 5 to 8 inches, one side of the pad electrode portion is set to several millimeters, meanwhile, a pixel pitch in the display panel of which resolution is 500 pixel per inch (ppi) is set to several tens micrometers, and both sizes are different in approximately double digits. That is, in a state in which the pixel array portion 30 and the touch sensor 32 overlap with each other, there is a positional relationship that one of the pad electrode portions 70a, 72a, and 74a is positioned to cover throughout a plurality of the pixels 82.

Figure 10:
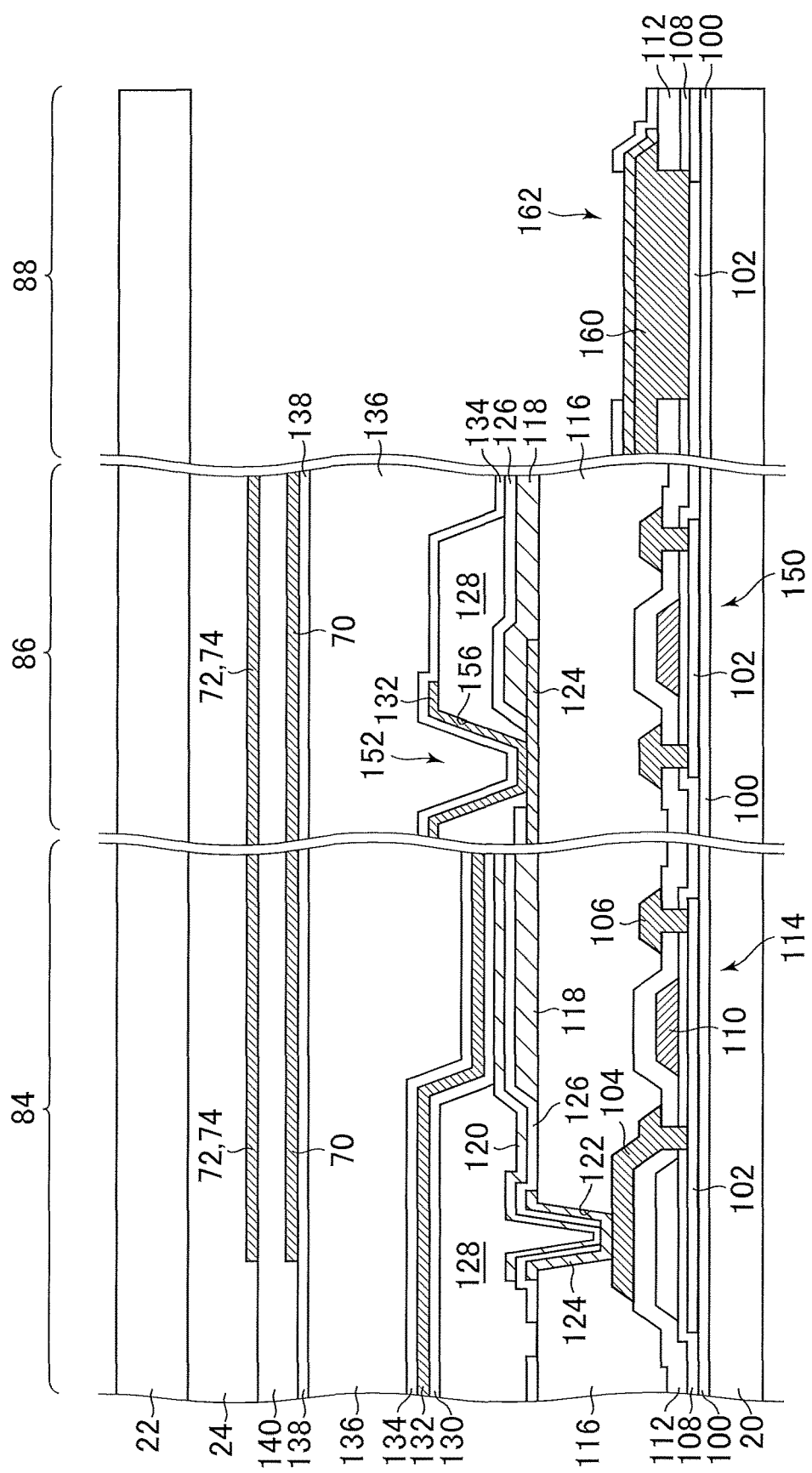
FIG. 10 is a schematic partial sectional view of the touch screen according to the embodiment of the invention.

FIG. 10 is a schematic vertical sectional view of the touch screen 10, and parts 84, 86, and 88 of the display region 12, a frame region, and a terminal portion on a section surface along the vertical direction in the touch screen 10 illustrated in FIG. 1 are illustrated.

First, the part 84 of the display region 12 will be described. The array substrate 20 is made of resin or glass. As the array substrate 20, a film having flexibility such as polyimide or polyethylene terephthalate, or the like can be used. An undercoat layer 100 having barrier effect against impurities contained in the substrate 20 is formed on the array substrate 20. The undercoat layer 100 is made of a silicon oxide film, a silicon nitride film, or the like, and may have a stacked structure of the films.

A semiconductor layer 102 is formed on the undercoat layer 100. A source electrode 104 and a drain electrode 106 are electrically connected to the semiconductor layer 102, and a gate insulating film 108 covering the semiconductor layer 102 is formed on the semiconductor layer. A gate electrode 110 is formed on the gate insulating film 108, and an interlayer insulating film 112 is provided to cover the gate electrode 110. The source electrode 104 and the drain electrode 106 penetrate the gate insulating film 108 and the interlayer insulating film 112. The semiconductor layer 102, the source electrode 104, the drain electrode 106, and the gate electrode 110 constitute a TFT 114. Additionally, the TFT 114 illustrated in the drawing is configured as an n-channel type, and corresponds to the driving TFT 56 of FIG. 4.

A flattening layer 116 is provided to cover the TFT 114. A wiring layer 118 and an anode 120 of the OLED (OLED 50 illustrated in FIG. 4) are provided on the flattening layer 116. For example, the anode 120 is a plurality of pixel electrodes which are configured to respectively correspond to a plurality of unit pixels (sub-pixels). The flattening layer 116 is formed so that at least a surface where the anode 120 is provided is flattened. As the flattening layer 116, an organic material such as photosensitive acrylic resin is usually used.

The anode 120 is electrically connected to the source electrode 104 of the TFT 114 through a contact hole 122 which penetrates the flattening layer 116. Specifically, a conductive film 124 made of indium tin oxide (ITO) and an insulating film 126 made of a silicon nitride film (SiN) with the wiring layer 118 are formed on the flattening layer 116 provided with the contact hole 122, and then the anode 120 is formed. The anode 120 is connected to the source electrode 104 through the conductive film 124 formed inside the contact hole 122.

In addition, a part is provided in which the anode 120 and the wiring layer 118 are disposed to be opposite to each other with the insulating film 126 sandwiched therebetween. A holding capacitor of the OLED is formed of the part.

An insulating layer 128 is formed on the flattening layer 116 and the anode 120. The insulating layer 128 is formed to have an opening portion exposing a part (for example, center portion) of the anode 120 while covering peripheral portions of the anode 120. A bank surrounding edges of the anode 120 is formed by the insulating layer 128.

A light emitting layer 130 of the OLED is stacked on the anode 120 and the bank constituted by the insulating layer 128. The light emitting layer 130 is formed on the entire surface which covers the display region 12. That is, the light emitting layer 130 is continued throughout the plurality of pixels and is formed on the bank constituted by the insulating layer 128 and the anode 120 which is exposed to the opening portion thereof. In this case, for example, the light emitting layer 130 is formed by vapor deposition. For example, the light emitting layer 130 can be configured to emit white light in all the sub-pixels, and to take out a desired color wavelength part in each sub-pixel using a color filter. Also, the light emitting layer 130 which emits a different color such as blue, red, green, or the like by corresponding to each pixel can be separately formed. In this case, the light emitting layer 130 can be formed, for example, by coating an organic material dispersed in a solvent.

In addition, the light emitting layer 130 may be configured with a stacked structure of organic materials including light-emitting materials, and may be configured with a stacked configuration of a carrier transportation material layer which is a hole transportation layer or an electron transportation layer, a carrier injection material layer which is a hole injection layer or an electron injection layer, and the like, in addition to the layer having light-emitting materials.

A cathode 132 of the OLED is formed on the light emitting layer 130. The cathode 132 is mounted on the insulating layer 128 which becomes the bank, and for example, it can be set to a common electrode throughout all the pixels of the display region 12. A stacked structure including the light emitting layer 130, the anode 120 and the cathode 132 corresponds to the OLED 50, and the light emitting layer 130 emits light by being controlled brightness thereof using current flowing between the anode 120 and the cathode 132. Also, the touch screen 10 is configured to radiate light, which is generated by the light emitting layer 130, from a display surface. Therefore, the cathode 132 is made of a transparent conductive material. As the transparent conductive material, for example, ITO, indium zinc oxide (IZO) which is a composite material of indium tin oxide and zinc oxide, or the like is used.

The OLED including the light emitting layer 130 is sealed by being covered with the insulating film 134 to be stacked on the cathode 132, and blocks moisture. The insulating film 134 may have a stacked structure including an inorganic film such as SiN.

An insulating film 138 made of SiN or the like is formed on a surface of the display panel flattened by the flattening layer 136, and the first electrodes 70 of the touch sensor 32 are formed on a surface of the insulating film 138. The first electrodes 70 of the display region 12 are the pad electrode portion 70a and the bridge wiring portion 70b described above. A configuration of FIG. 10 includes a stacked structure configured with the insulating film 134 including an inorganic film as a sealing layer, the flattening layer 136, and the insulating film 138 including an inorganic layer.

At this time, an end portion of the flattening layer 136 is set to be inside end portions of the insulating films 134 and 138, that is, a side close to the display region, and the insulating films 134 and 138 come into contact with each other on the outside of the end portion of the flattening layer 136, that is, a side close to an end of the substrate, and thereby making it possible to prevent moisture from invading from the end portion of the flattening layer 136.

An elastic material layer 140 is stacked on the first electrodes 70 as the insulating film 80 illustrated in FIG. 8. As a material of the elastic material layer 140, a dielectric material can be used, and for example, polyurethane, cellulose acetate, and the like can be used. Since these materials can be formed as layers using water or a highly volatile solvent (ethanol, acetone, or the like), a film can be formed at a low temperature (approximately 100° C. or less) at which the light emitting layer 130 is not damaged.

In addition, the elastic material layer 140 in which highly elastic particles are dispersed in a binder material also can be used. The binder material can be set to resin such as epoxy resin or acrylic resin which is cured by heat or ultraviolet rays. The elastic particles are dispersed in a liquid type binder material, and a film is formed and cured by coating, or the like, the binder material on a surface in which the first electrodes 70 are formed. Even when elasticity of the cured binder material which constitutes the film is decreased, the film itself is capable of having elasticity at which a thickness of the film is easily changed in accordance with touching of a finger or the like thereto by dispersing highly elastic particles thereof, and the film can be used as the elastic material layer 140. Also, it is preferable that a material of which a difference in refractive index from the binder material is not present or is little is used as the particles, or beads such as acryl may be used.

Only a part of the elastic material layer 140 which is sandwiched between the first electrodes 70 and the third electrodes 74 is formed of a material having high elasticity, and another part thereof may be formed of a material having low elasticity. Such an elastic material layer which is locally formed can be formed by, for example, a photolithography method, a transfer printing method, or an inkjet method. When the elasticity of the elastic material layer 140 is locally increased by corresponding to the third electrodes 74 constituting the electrostatic capacitance-type pressure sensor, force from a subject such as a finger touching the display surface of the touch screen 10, which is applied to the touch sensor 32, is easily focused on a part corresponding to the third electrodes 74 in the touching surface, and sensitivity of the pressure sensor can be improved.

The second electrodes 72 and the third electrodes 74 are formed on the elastic material layer 140 (or the insulating film 80 in which the elastic material layer is locally formed).

The second electrodes 72 and the third electrodes 74 of the display region 12 are the pad electrode portions 72a and 74a and the bridge wiring portions 72b and 74b described above.

Since the touch screen 10 is necessary to transmit light from the light emitting layer 130 at least in the display region 12 as described above, the first electrodes 70, the second electrodes 72, and the third electrodes 74 of the touch sensor 32 are formed of a transparent conductive film made of a transparent conductive material. In addition, the elastic material layer 140 is formed of a transparent elastic material.

The array substrate 20 in which the touch sensor 32 is formed is bonded to a cover glass or a resin film which is the display surface protecting film 22 through the adhesive layer 24.

Next, regarding a part 86 of the frame region, a different point from the part 84 described above will be described. For example, a TFT 150 of a p-channel is formed on the undercoat layer 100. A cathode contact 152 is formed on the flattening layer 116. In the cathode contact 152, the cathode 132 is electrically connected to the conductive film 124 formed on the flattening layer 116 through the contact hole 156 penetrating the insulating layer 128, and the cathode 132 is connected to a power source through the wiring layer 118 connected to the conductive film 124.

After the cathode contact 152 is formed, the insulating film 134, the flattening layer 136, and the insulating film 138 are stacked, and the first electrodes 70, the elastic material layer 140, the second electrodes 72, and the third electrodes 74 constituting the touch sensor 32 are formed on a surface of the insulating film 138. The first electrodes 70 disposed on the frame region constitutes the leading-out wirings 76 as described above, and the second electrodes 72 and the third electrodes 74 constitute the leading-out wirings 78 as described above.

The terminal portion 88 is positioned on the component mounting region 14. In the terminal portion 88, a terminal 162 which connects a wiring 160 taken out from the display panel of the display region 12 or the touch sensor 32 to a circuit outside of the touch screen 10 is formed. A structure of the touch sensor 32 is basically formed on the display region 12 and the frame region, but is not formed on the terminal portion 88 or the component mounting region 14.

The sensor controlling circuit 40, and the like are provided on a circuit connected to the terminal portion 88, or the driver IC 16 of the component mounting region 14.

The sensor controlling circuit 40 has a function of touch detection for detecting changes of the electric signal in accordance with presence and absence of touching and a function of pressure detection for detecting changes of the electric signal in accordance with magnitude of pressure, by corresponding that the touch sensor 32 includes a structure of the touch sensor in an electrostatic capacitance manner and a structure of an electrostatic capacitance-type pressure sensor.

In the touch detection in the touch sensor 32, for example, an AC signal such as a rectangular pulse is input to the driving electrode Tx, and the electric signal generated in the detecting electrode Rx is detected. Voltage change generated in the detecting electrode Rx due to capacitive coupling of the driving electrode Tx and the detecting electrode Rx varies in accordance with a position where a subject touched a display surface and a position where the subject not touched. Specifically, since the capacitive coupling is also generated between the subject and Tx at the position where the subject touched, the capacitive coupling between Tx and Rx is partially inhibited and weakened, and amplitude of an output pulse generated in Rx with respect to an input pulse to Tx is reduced. The sensor controlling circuit 40 in this manner specifies a set of the driving electrodes Tx and the detecting electrodes Rx corresponding to a touching position, when the AC signal is applied by sequentially selecting the driving electrodes Tx and the amplitude of the output signal of the detecting electrode Rx is compared with a reference value.

In the pressure detection in the touch sensor 32, for example, when the AC signal such as the rectangular pulse is input to one of the electrodes Tx and Px, charging and discharging current in accordance with an electrostatic capacitance C between the electrodes Tx and Px is measured. Specifically, a gap is formed between the electrodes Tx and Px by the elastic material layer, and the electrostatic capacitance C according to an interval d between Tx and Px and permittivity E of the elastic material layer is generated. In a part where the subject touched the display surface, a film thickness of the elastic material layer, that is, the interval d is reduced due to pressing force of the subject, and thus the electrostatic capacitance C is increased, and the current according to charging and discharging is also increased. Here, the sensor controlling circuit 40, for example, measures the charging and discharging current of the electrode Px by applying pulse to the electrode Tx. The pressing force can be obtained from an amount of the charging and discharging current.

The sensor controlling circuit 40 can be configured to alternately operate a touch detection operation and a pressure detection operation of the touch sensor 32, or can be configured to simultaneously operate the touch detection operation and the pressure detection operation. The touch detection and the pressure detection can be alternately performed as follows. For example, the touch detection operation, in which a voltage of each of the electrodes Rx is detected by sequentially applying pulse to the electrodes $Tx_1$ to $Tx_\alpha$, and the pressure detection operation, in which an amount of charging and discharging of each of the electrodes Px is detected by maintaining the electrodes $Tx_1$ to $Tx_\alpha$ to be constant potential and applying pulse to each of the electrodes Px, are alternately performed. In addition, the touch detection operation, in which a voltage of each of the electrodes Rx is detected by sequentially selecting the electrodes $Tx_1$ to $Tx_\alpha$ and applying pulse to the selected $Tx_j$, and the pressure detection operation, in which an amount of charging and discharging of the electrode $Tx_j$ is detected by maintaining each of the electrodes Px to be constant potential and applying the pulse to the electrode $Tx_1$, can be sequentially performed. Meanwhile, the touch detection and the pressure detection can be simultaneously performed as follows. For example, the electrodes $Tx_1$ to $Tx_\alpha$ are sequentially selected, the pulse is applied to the selected $Tx_j$, and responses of the electrodes Rx and responses of the electrode Px with respect to the pulse are simultaneously detected.

Also, in the touch detection operation described above, the response of the electrode Rx with respect to each pulse is detected by applying pulse to the electrode Tx (odd-numbered electrode $Tx_{2k-}$ in example of FIG. 5) which overlaps with the pad electrode portions 72a of the electrode Rx and the electrode Tx (even-numbered electrode $Tx_{2k}$ in example of FIG. 5) including the pad electrode portion 70a positioned to be adjacent to the pad electrode portion 72a of the electrode Rx at a different timing from each other. Accordingly, a touching position or a touching region in the display surface relating to a Tx arrangement direction can be basically obtained with accuracy of $\lambda_y/2$.

A scanning method can be used, in addition to the method in which the electrodes Tx are sequentially selected one by one and pulse is applied thereto described above. For example, a scanning method in which pulse is simultaneously applied to a pair of electrodes by sequentially selecting the pair of the electrodes constituted by two adjacent electrodes Tx can be used. Specifically, for example, the electrodes $Tx_{2k-1}$ and $Tx_{2k}$ (k is a natural number) are set to a k pair of electrodes, and operation in which responses to applying pulse to a k pair of electrodes are detected is repeated by changing k in turn. In the operation for a k pair of electrodes, a pulse is applied to the pair of electrodes simultaneously, and then, the voltage change generated in the electrode Rx and the amounts of charging and discharging current of the electrode $Tx_{2k-1}$ or $Tx_{2k}$ are detected as the responses to the pulse. In this scanning method, a detection accuracy of a touching position relating to the Tx arrangement direction is basically set to $\lambda_y$, and a scanning cycle can be shortened further than that of a method of sequentially scanning each Tx.

In the embodiment described above, the example of which the electrodes Rx and the electrodes Px are alternately arranged every other is described, but an arrangement of both electrodes is not limited thereto. As a relatively simple regular arrangement, for example, the m (m is a natural number) electrodes Rx which are disposed to be adjacent to each other and n (n is a natural number) electrodes Px which are disposed to be adjacent to each other can be alternately disposed. In addition, the electrodes Rx and the electrodes Px may be mixed and arranged in further complex rule.

Second Embodiment

Figure 11:
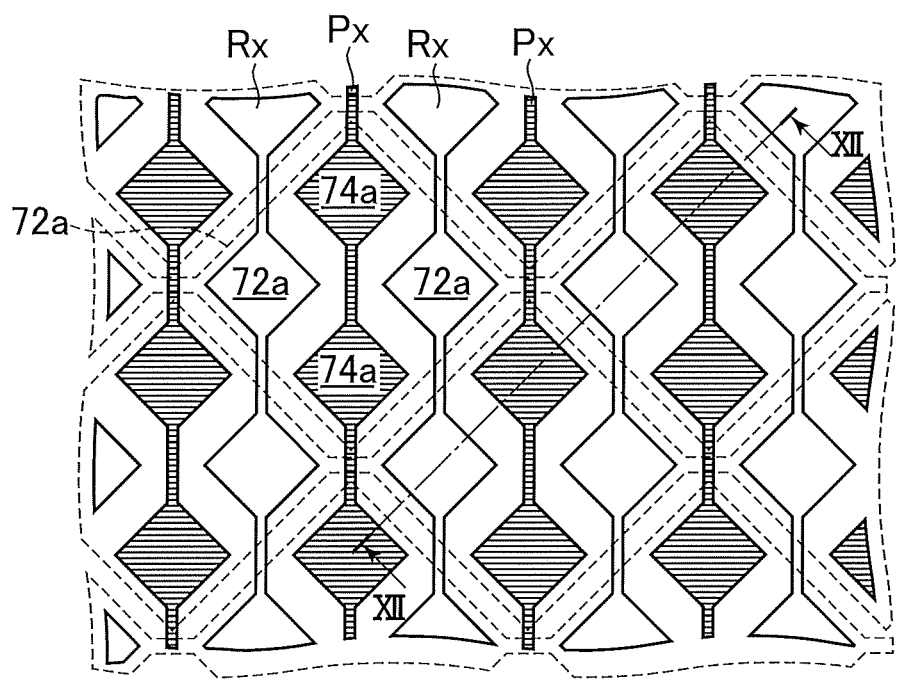
FIG. 11 is a schematic partial plan view illustrating patterns of electrodes in a touch screen according to a second embodiment of the invention.
Figure 12:
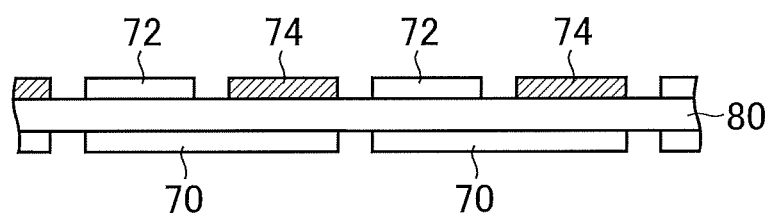
FIG. 12 is a schematic partial sectional view of the touch screen taken along line XI-XI of FIG. 11.

A second embodiment of the invention will be described by focusing on differences from the first embodiment described above. FIG. 11 is a schematic partial plan view illustrating patterns of the electrodes Tx, Rx, and Px in the touch screen relating to the second embodiment, and FIG. 12 is a schematic partial sectional view of the touch screen taken along line XII-XII of FIG. 11. A main difference of the second embodiment from the first embodiment is that a length of one side of an approximate rhombus shape of each of the pad electrode portions 70a of the electrodes Tx is twice a length of one side of each of the pad electrode portions 72a and 74a of the electrodes Rx and Px. The pad electrode portion 70a is approximately a rhombus shape same as that of the pad electrode portion 70a of the first embodiment, an area thereof is approximately four times, and two of the pad electrode portions 72a and 74a are disposed to face one of the pad electrode portions 70a.

Specifically, there are two manners of arrangement of the pad electrode portions 72a and 74a, one is a first pattern (pattern illustrated in FIG. 11) in which the pad electrode portions 72a of two electrodes Rx are arranged along diagonals of the horizontal direction of the pad electrode portions 70a and the pad electrode portions 74a of two electrodes Px are arranged in a row along diagonals of the vertical direction of the pad electrode portions 70a, and another is a second pattern in which the pad electrode portions 74a of two electrodes Px are arranged in a row along diagonals of the horizontal direction of the pad electrode portions 70a and the pad electrode portions 72a of two electrodes Rx are arranged along diagonals of the vertical direction of the pad electrode portions 70a.

Even in any of the patterns, a scanning cycle same as that of the scanning method in which pulse is simultaneously applied to the pair of electrodes constituted by the two adjacent electrodes Tx described in the first embodiment, can be applied thereto, and can be corresponded to scanning at high frame rate.

Here, in the first pattern, each pad electrode portion 72a of any one of the electrodes Rx separately faces the electrodes Tx. In addition, two pad electrode portions 72a of the electrodes Rx facing any one of the pad electrode portions 70a are separate electrodes Rx. Accordingly, in the touch detection operation described above in which a set of the electrodes Tx, to which pulse is applied, and the electrodes Rx, in which amplitude of output pulse is reduced, is specified, touching with respect to each of the pad electrode portions 72a of the electrodes Rx can be identified. At this point, in the second pattern, these touching with respect to the two pad electrode portions 72a cannot be discriminated. That is, a touching position in the first pattern can be detected with high accuracy compared to the second pattern. Specifically, the touch sensor 32 including electrode patterns of FIG. 11 is capable of detecting the touching position with resolution performance $\lambda_x$ in the horizontal direction and $\lambda_y$ in the vertical direction.

The electrodes Tx of the embodiment are also densely laid on the display region 12 in the same manner as the first embodiment, and a shielding function for blocking the electrodes Rx from noise caused by the driving signals of the display panel is provided.

Configuration Example Relating to Invention

Figure 13:
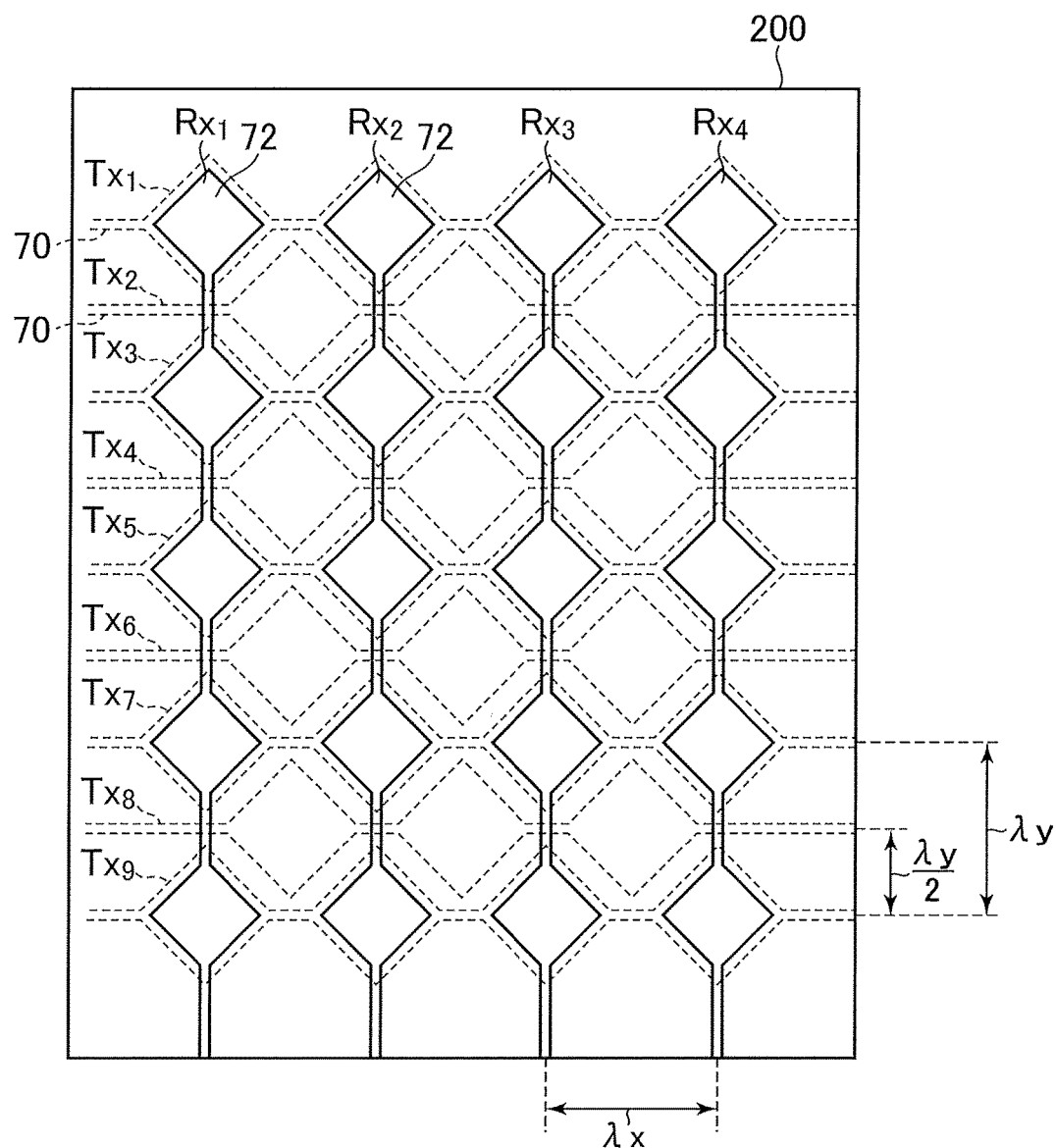
FIG. 13 is a schematic plan view of a configuration example of the touch sensor relating to the invention.
Figure 14:
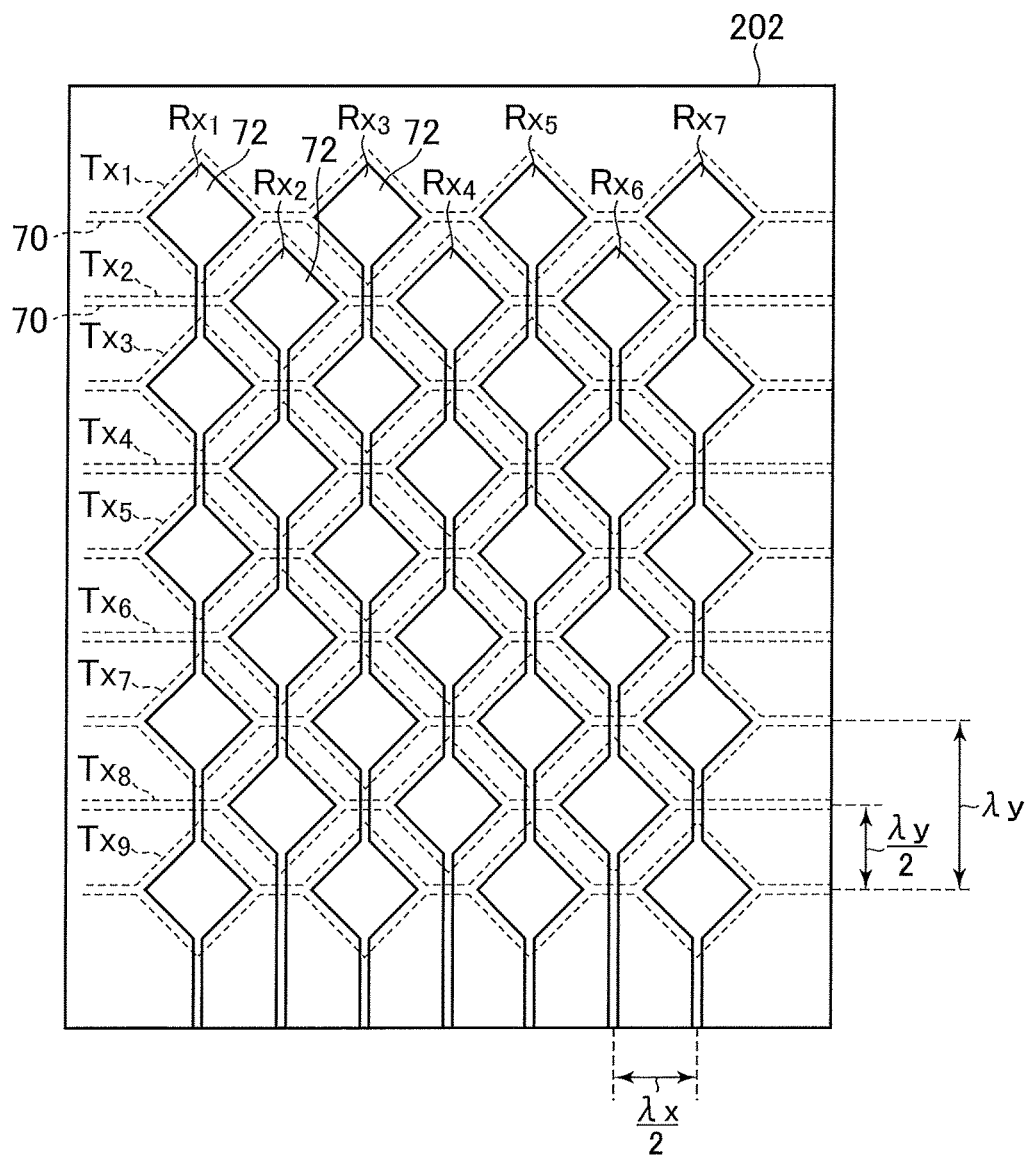
FIG. 14 is a schematic plan view of another configuration example of the touch sensor relating to the invention.

FIGS. 13 and 14 are schematic plan views of a touch sensor in which the electrostatic capacitance-type pressure sensor is omitted from the configuration of the first embodiment.

A touch sensor 200 of FIG. 13 is different from the touch sensor 32 of the first embodiment in that the electrodes Px are not included in gaps between the electrodes Rx. That is, the plurality of electrodes Rx overlapping with a partial region of the electrodes Tx are arranged on a surface of the touch sensor 200, but the electrodes Px are not arranged between the electrodes. Specifically, the electrodes Tx in which the pad electrode portions 70a are arranged in a row at a pitch of $\lambda_x$ in the horizontal direction are arranged in the arrangement cycle $\lambda_y/2$ in the vertical direction on a rear side of an insulating film corresponding to the insulating film 80 of the embodiment, and a surface of the insulating film, the electrodes Rx in which the pad electrode portions 72a are arranged in a row at a pitch of $\lambda_y$ in the vertical direction are arranged in the arrangement cycle $\lambda_x$ in the horizontal direction.

A touch sensor 202 of FIG. 14 has a configuration in which the electrodes Px of the first embodiment are substituted by the electrodes Rx. That is, the configuration of FIG. 14 is different from that of FIG. 13 in that the arrangement cycle of the horizontal direction of the electrodes Rx formed on the surface of the touch sensor 202 is half of that of a configuration of FIG. 13. Specifically, on the surface of the touch sensor 202, the electrodes Rx in which the pad electrode portions 72a are arranged in a row at the pitch of $\lambda_y$ in the vertical direction are arranged in the arrangement cycle $\lambda_x/2$ in the horizontal direction.

Also, in the configurations of FIGS. 13 and 14, a function of the electrostatic capacitance-type pressure sensor is omitted, and thus a part constituted by an elastic material layer is not necessarily provided on the insulating film between the electrodes Tx and the electrodes Rx.

As described above, the touch sensors 200 and 202 of FIGS. 13 and 14 are different from the embodiments described above in that a function of a pressure sensor is not included. Meanwhile, the electrodes Tx of the touch sensors 200 and 202 are densely laid on the display region in the same manner as that of the embodiments. Accordingly, in the same as the embodiments described above, the touch sensors 200 and 202 have a shielding function for blocking the electrodes Rx from noise caused by the driving signal or the like of a device such as the display panel which is disposed on a rear surface side thereof.

Hitherto, in the embodiments described above, as a disclosed example, a case in which the display panel constituting the touch screen is an organic EL display device is exemplified; however, as another application example, all of flat panel type display devices, such as liquid crystal display devices, another self-emitting type display devices, or electronic paper type display devices including electrophoretic elements, and the like are exemplified. In addition, it is needless to say that the embodiments can be applied to any device in medium or small size to large size without being limited.

Also, the display device is not limited to an organic electroluminescence display device, may be a display device in which a light emitting element such as a quantum-dot light emitting diode (QLED) is provided to each pixel, and may be a liquid crystal display device.

The invention is not limited to the embodiments described above, and can be variously modified. For example, the configurations described in the embodiments can be substituted by substantially a same configuration, a configuration in which the same action effect achieves, or a configuration in which the same object can be achieved.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A touch sensor comprising:
    first electrodes that are a plurality of driving electrodes of an electrostatic capacitance-type touch sensor, each extend in a first direction, and are arranged in a second direction intersecting the first direction;
    an insulating film that is stacked on the first electrodes;
    second electrodes that are a plurality of detecting electrodes of the touch sensor, are formed on the insulating film, overlap with partial regions of the first electrodes, each extend in the second direction, and are arranged in the first direction; and
    third electrodes that are a plurality of electrodes formed in gaps between the second electrodes, overlapping with other partial regions of the first electrodes, each extend in the second direction, and are arranged in the first direction, on the insulating film,
    wherein a film thickness of the insulating film between the first electrodes and the third electrodes varies due to pressing force in a film thickness direction, and the insulating film constitutes an electrostatic capacitance-type pressure sensor with the first electrodes and the third electrodes,
    wherein one of the first electrodes includes a first pad portion and a first bridge wiring portion having a width shorter than a length of one side of the first pad portion,
    wherein one of the third electrodes includes a third pad portion, and
    wherein the third pad portion overlaps with the first pad portion without protruding from the first pad portion in a plan view.

2. The touch sensor according to claim 1,
    wherein the insulating film includes an elastic material.

3. The touch sensor according to claim 1,
    wherein the insulating film is continuously provided throughout regions overlapping with the second electrodes and regions overlapping with the third electrodes.

4. The touch sensor according to claim 1,
    wherein one of the second electrodes includes a second pad portion and a second bridge wiring portion having a width shorter than a length of one side of the second pad portion,
    wherein one of the third electrodes includes another third pad portion and a third bridge wiring portion having a width shorter than a length of one side of the third pad portion, and
    wherein the third bridge wiring portion connecting the third pad portion and the another third pad portion.

5. The touch sensor according to claim 4,
    wherein the second pad portion overlaps with the first pad portion without protruding from the first pad portion in a plan view.

6. The touch sensor according to claim 4,
    wherein the third pad portion is located without overlapping with the second pad portion in the plan view.

7. The touch sensor according to claim 1,
    wherein the number of the second electrodes is greater than the number of the third electrodes.

8. The touch sensor according to claim 1,
    wherein the third pad portion is located without overlapping with the first bridge portion in the plan view.

9. A touch screen comprising:
    a plurality of pixels that are formed on a substrate and each include a light emitting element;
    a sealing layer that is provided to cover the plurality of pixels;
    first electrodes that are a plurality of driving electrodes of an electrostatic capacitance-type touch sensor, are formed on the sealing layer, each extend in a first direction, and are arranged in a second direction intersecting the first direction;
    an insulating film that is stacked on the first electrodes;
    second electrodes that are a plurality of detecting electrodes of the touch sensor, are formed on the insulating film, overlap with partial regions of the first electrodes, each extend in the second direction, and are arranged in the first direction; and
    third electrodes that are a plurality of electrodes formed in gaps between the second electrodes overlapping with other partial regions of the first electrodes, each extend in the second direction, and are arranged in the first direction, on the insulating film,
    wherein a film thickness of the insulating film between the first electrodes and the third electrodes varies due to pressing force in a film thickness direction, and the insulating film constitutes an electrostatic capacitance-type pressure sensor with the first electrodes and the third electrodes,
    wherein one of the first electrodes includes a first pad portion and a first bridge wiring portion having a width shorter than a length of one side of the first pad portion,
    wherein one of the third electrodes includes a third pad portion, and wherein the third pad portion overlaps with the first pad portion without protruding from the first pad portion in a plan view.

10. The touch screen according to claim 9, wherein the insulating film includes an elastic material.

11. The touch screen according to claim 9, wherein the insulating film is continuously provided throughout regions overlapping with the second electrodes and regions overlapping with the third electrodes.

12. The touch screen according to claim 9, further comprising:
a display region that is provided with the plurality of pixels, and
wherein the second electrodes and the third electrodes are provided apart from each other within the display region.

13. The touch screen according to claim 9, wherein one of the second electrodes includes a second pad portion and a second bridge wiring portion having a width shorter than a length of one side of the second pad portion, wherein one of the third electrodes includes another third pad portion and a third bridge wiring portion having a width shorter than a length of one side of the third pad portion, and wherein the third bridge wiring portion connecting the third pad portion and the another third pad portion.

14. The touch screen according to claim 13, wherein an area of the first pad portion is four times or more an area of the second pad portion.

15. The touch screen according to claim 14, wherein the area of the first pad portion is four times or more an area of the third pad portion.

16. The touch sensor according to claim 13, wherein the third pad portion is located without overlapping with the second pad portion in the plan view.

17. The touch screen according to claim 9, wherein the number of the second electrodes is greater than the number of the third electrodes.

18. The touch sensor according to claim 9, wherein the third pad portion is located without overlapping with the first bridge portion in the plan view.

* * * * *